(12) United States Patent
Oh

(10) Patent No.: US 7,863,185 B2
(45) Date of Patent: Jan. 4, 2011

(54) ARTIFICIALLY TILTED VIA CONNECTION

(75) Inventor: Hyeoksang Oh, Fishkill, NY (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 211 days.

(21) Appl. No.: 12/166,384

(22) Filed: Jul. 2, 2008

(65) Prior Publication Data

US 2010/0001406 A1 Jan. 7, 2010

(51) Int. Cl.
*H01L 21/00* (2006.01)
(52) U.S. Cl. .............. 438/637; 438/640; 438/672; 257/774
(58) Field of Classification Search .............. None
See application file for complete search history.

(56) References Cited

U.S. PATENT DOCUMENTS

| 6,326,306 | B1 * | 12/2001 | Lin ............... 438/687 |
| 6,569,604 | B1 * | 5/2003 | Bhatt et al. ............ 430/311 |
| 7,157,366 | B2 * | 1/2007 | Kim et al. ............ 438/622 |
| 7,220,665 | B2 * | 5/2007 | Farrar ............... 438/622 |
| 2002/0086475 | A1 * | 7/2002 | Havemann ............ 438/200 |

* cited by examiner

*Primary Examiner*—Jarrett J Stark
*Assistant Examiner*—Nicholas Tobergte
(74) *Attorney, Agent, or Firm*—F. Chau & Associates, LLC

(57) ABSTRACT

A semiconductor integrated circuit with tilted via connection and related method are provided, the circuit including a via layer having at least one tilted via, and a wireway layer having at least one elongated wireway disposed above the via layer, wherein the wireway connects to and partially overlaps the tilted via; and the method including forming a via layer, patterning a via trench in the via layer, forming a wireway layer, patterning an elongated wireway in the wireway layer, etching the patterned wireway and the patterned via, and filling the etched wireway and the etched via with a conductive material, wherein the filled wireway partially overlaps the filled via.

19 Claims, 9 Drawing Sheets

ARTIFICIALLY TILTED VIA CONNECTION

BACKGROUND OF THE INVENTION

The present disclosure generally relates to via connections in semiconductor integrated circuits. More particularly, the present disclosure relates to artificially tilted via connections.

In conventional semiconductor integrated circuits, the spacing between two metal lines is typically small, and determined mainly in correspondence with the underlying via connections and design rule. Due to variations in the manufacturing process, such small spacings generally reduce yield or process margins by causing short circuits and/or reliability failures in a portion of the products.

In addition, the spacing between metal lines is further decreased as design rules are decreased. Thus, the lithography and Reactive Ion Etching (RIE) process margins are degraded. This further increases the possibility of shorts between neighboring lines, which generally leads to reliability failures, such as Time Dependent Dielectric Breakdown (TDDB).

SUMMARY OF THE INVENTION

These and other issues are addressed by integrated circuits and methods for forming artificially tilted via connections. Exemplary embodiments are provided.

An exemplary semiconductor integrated circuit includes a via layer having at least one tilted via; and a wireway layer having at least one elongated wireway disposed above the via layer; wherein the wireway connects to and partially overlaps the tilted via.

An exemplary method for forming a tilted via connection in a semiconductor integrated circuit includes forming a via layer; patterning a via trench in the via layer; forming a wireway layer; patterning an elongated wireway in the wireway layer; etching the patterned wireway and the patterned via; and filling the etched wireway and the etched via with a conductive material, wherein the filled wireway partially overlaps the filled via.

Another exemplary method is wherein a portion of the via extends from at least an end of the elongated wireway. Yet another exemplary method is wherein a portion of the via extends from at least a side of the elongated wireway. Still another exemplary method is wherein the filled wireway completely overlaps a top end of the filled via. Another exemplary method is wherein the filled wireway does not overlap a bottom end of the filled via. Yet another exemplary method is wherein the conductive material comprises metal. Still another exemplary method is wherein the conductive material comprises copper (Cu). Another exemplary method is wherein the artificially tilted via connection is realized within a copper dual-damascene process.

A further exemplary method further includes applying a Chemical Vapor Deposition (CVD) process to close the via trench before patterning the wireway trench. A further exemplary method is wherein the CVD process comprises at least one of SiO2, SiH4, TEOS, OMCTS2.7, p-SiCOH (with k=2.4, 2.2 and lower k) to meet electrical performance criteria. Yet a further exemplary method is wherein the CVD process comprises application of CVD skills and process conditions to control the via Critical Dimensions (CD) in-situ. Still a further exemplary method is wherein the CVD process comprises application of CVD skills and process conditions to control the via Critical Dimensions (CD) ex-situ.

Another exemplary method has patterning comprising at least one of lithography or Reactive Ion Etching (RIE). Yet another exemplary method has lithography comprising at least one rule to draw the photo mask or to generate an Optical Proximity Correction (OPC). Still another exemplary method has etching comprising at least one of Reactive Ion Etching (RIE) or wet etching.

Another exemplary method has forming comprising at least one of a barrier metal or seed copper deposition process. Yet another exemplary method has the at least one barrier metal or seed copper deposition process comprising at least one of Pre-Metal Deposition (PMD), Chemical Vapor Deposition (CVD), or Atomic Layer Deposition (ALD). Still another exemplary method has filling comprising copper plating to satisfy gap-filling performance criteria. Another exemplary method has forming comprising deposition of an Inter Layer Dielectric (ILD) layer substantially the same height as the trench to be formed therein.

The present disclosure will be further understood from the following description of exemplary embodiments, which is to be read in connection with the accompanying drawings.

BRIEF DESCRIPTION OF THE DRAWINGS

The present disclosure provides integrated circuits and methods for artificially tilted via connections in accordance with the following exemplary figures, in which.

DETAILED DESCRIPTION OF PREFERRED EMBODIMENTS

A method for forming semiconductor integrated circuits with artificially tilted via connections is provided. Exemplary embodiments realize artificially tilted metal to via connections in a copper dual-damascene processes.

Exemplary methods to form a tilted via connection may include Chemical Vapor Deposition (CVD) processes to close contacts that are formed in an Inter Layer Dielectric (ILD) layer, where the ILD layer is the height of the intended via; barrier metal and seed copper deposition processes using technologies such as Pre-Metal Deposition (PMD), Chemical Vapor Deposition (CVD), Atomic Layer Deposition (ALD), and the like; and copper plating technology such as processes to meet gap-filling performance criteria.

Optionally, the CVD deposition process may include processes such as SiO2 (SiH4, TEOS), OMCTS2.7, p-SiCOH (k=2.4, 2.2 and lower k), and the like, to satisfy electrical performance targets. The CVD deposition process may include the CVD criteria and process conditions to control the via Critical Dimensions (CD) in-situ or ex-situ. Processes for lithography and Reactive Ion Etching (RIE) may be applied for patterning the trenches.

Lithography techniques may include rules to draw the photo mask, to generate Optical Proximity Correction (OPC), and the like. Etching techniques may include RIE and wet processes.

Figure 1:
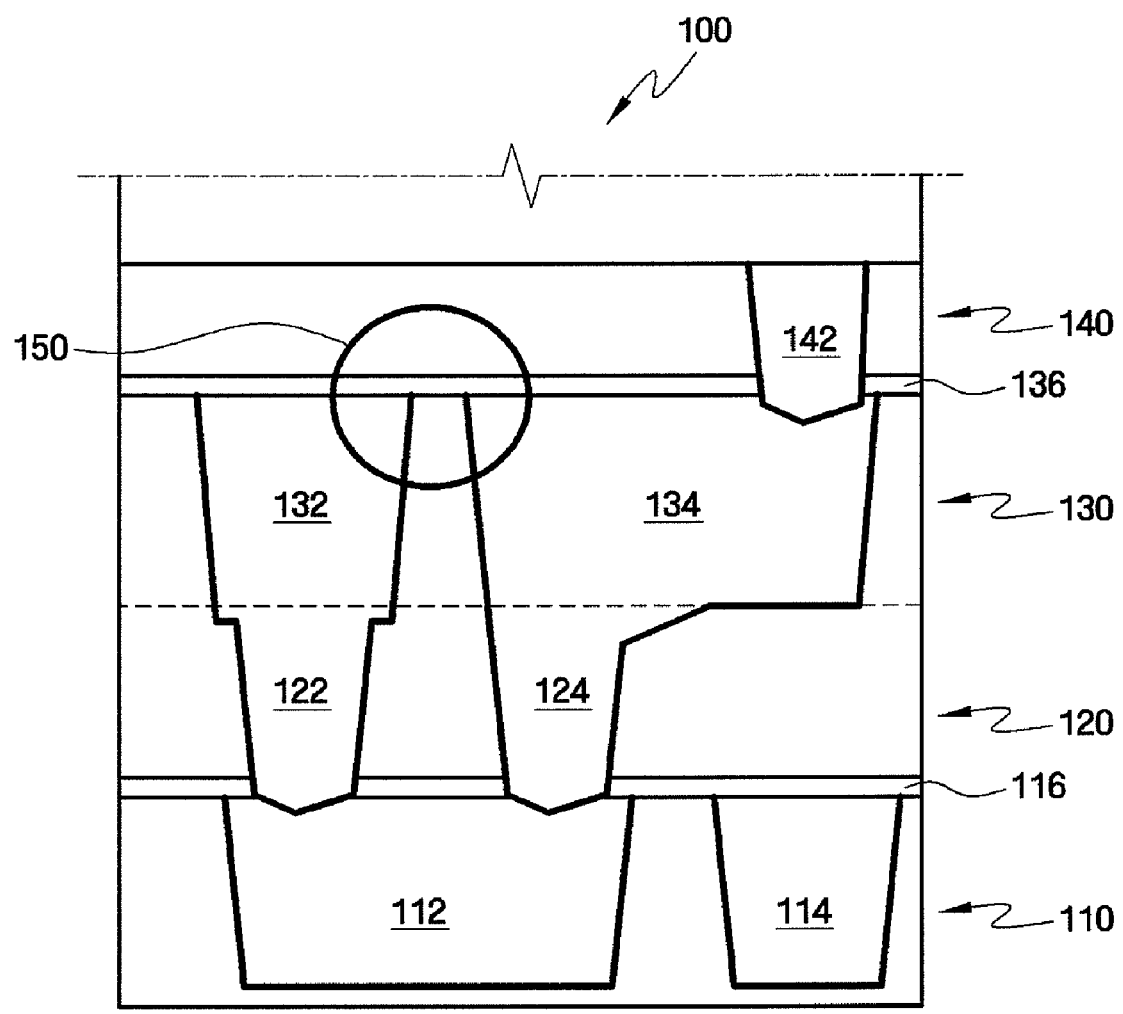
FIG. 1 shows a schematic side view of a semiconductor integrated circuit having substantially upright via connections.

As shown in FIG. 1, a semiconductor integrated circuit with substantially upright via connections is indicated generally by the reference numeral 100. The semiconductor integrated circuit 100 includes a first layer 110 having logic structures 112 and 114; a second layer 120 having vias 122 and 124 connected to the logic structure 120; a third layer 130 having a metal line 132 connected to the via 122, and a metal line 134 connected to the via 124; and a fourth layer 140 having an electrode 142 connected to the metal line 134. Here, the third layer 130 has a gap 150 between the metal lines 132 and 134.

Figure 2:
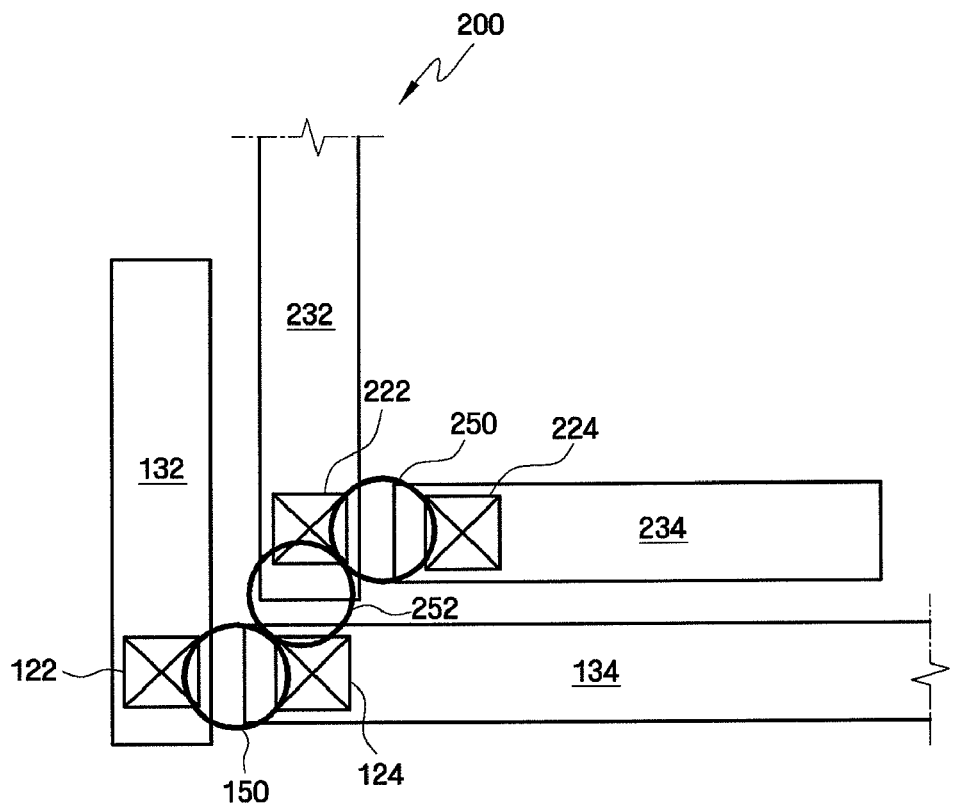
FIG. 2 shows a schematic top view of a semiconductor integrated circuit having substantially upright via connections.

Turning to FIG. 2, metal lines and via connections of the semiconductor integrated circuit 100 of FIG. 1 are indicated generally by the reference numeral 200. The first metal line 132 completely covers and is connected to the first via 122; the second metal line 134 completely covers and is connected to the second via 124; a third metal line 232 completely covers and is connected to a third via 222; and a fourth metal line 234 completely covers and is connected to a fourth via 224. Thus, a gap 150 between the metal lines 132 and 134 is smaller than a gap between the vias 122 and 124. Similarly, a gap 250 between the metal lines 232 and 234 is smaller than a gap between the vias 222 and 224; and a gap 252 between the metal lines 232 and 134 is smaller than a gap between the vias 222 and 124.

Figure 3:
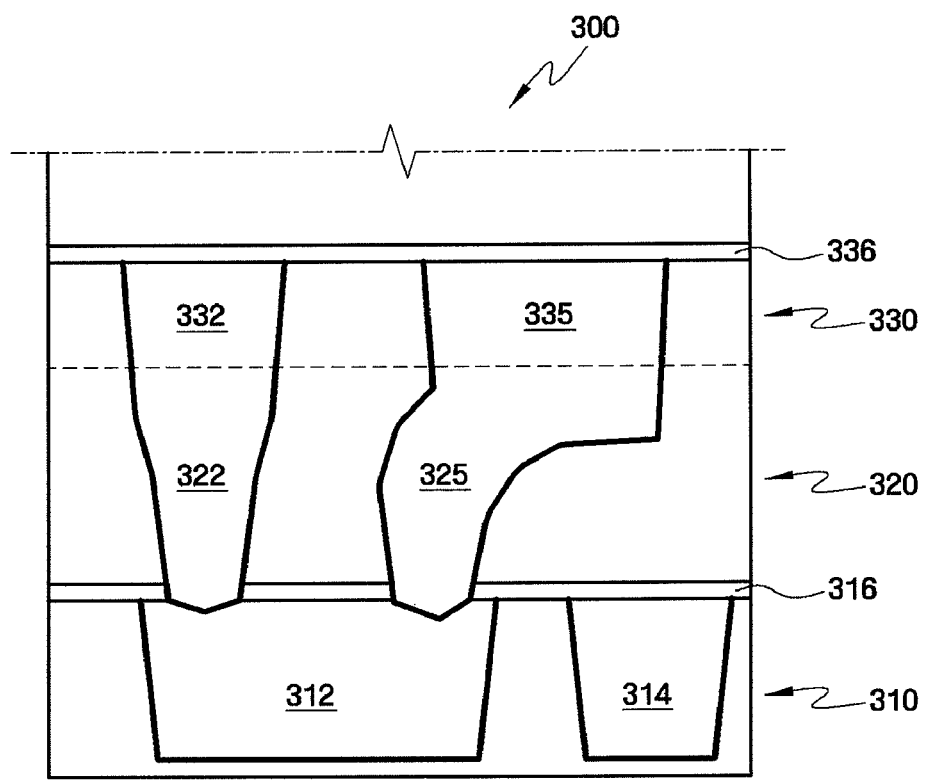
FIG. 3 shows a schematic side view of a semiconductor integrated circuit having artificially tilted via connections in accordance with an exemplary embodiment of the present disclosure.

Turning now to FIG. 3, a semiconductor integrated circuit with artificially tilted via connections is indicated generally by the reference numeral 300. The semiconductor integrated circuit 300 includes a first layer 310 having logic structures 312 and 314; a second layer 320 having vias 322 and 325 connected to the logic structure 312; and a third layer 330 having a metal line 332 connected to the via 322, and a metal line 335 connected to the via 325.

In comparison with the circuit 100 of FIG. 1, a gap between the vias 322 and 325 of the circuit 300 of FIG. 3 is greater than the gap between the vias 122 and 124. Moreover, a gap between the metal lines 332 and 335 may be greater than the gap between the vias 322 and 325, and is greater than the gap between the metal lines 132 and 134.

Figure 4:
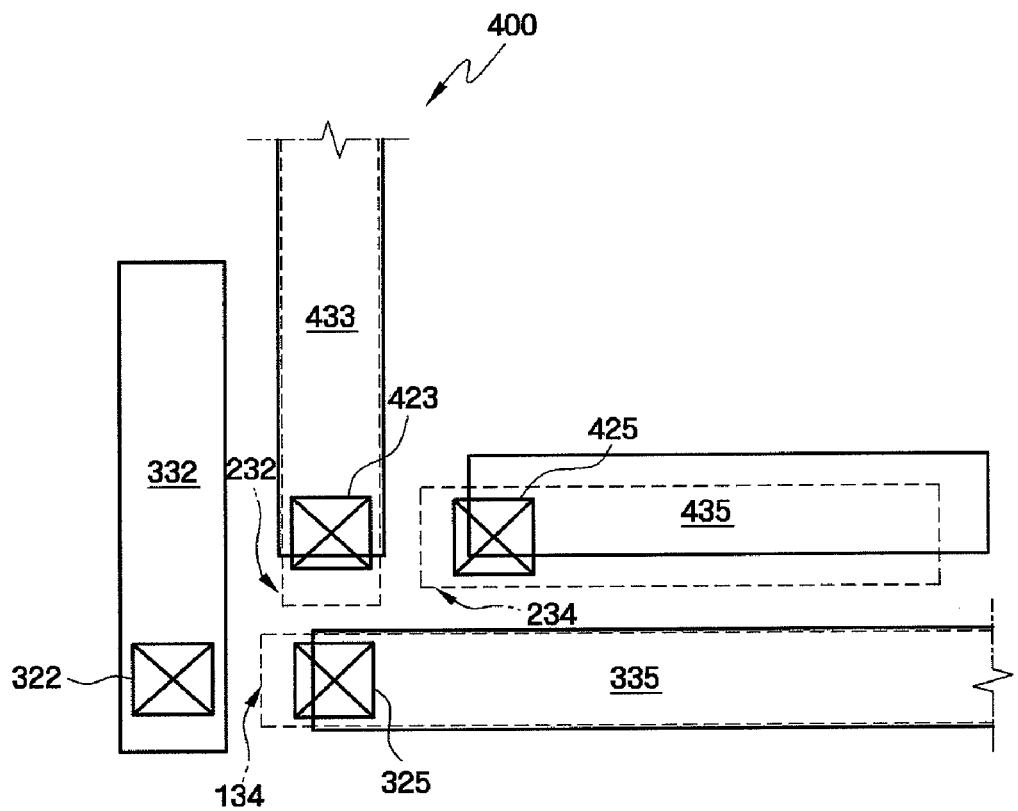
FIG. 4 shows a schematic top view of a semiconductor integrated circuit having artificially tilted via connections in accordance with an exemplary embodiment of the present disclosure.

Turning to FIG. 4, metal lines and via connections of the semiconductor integrated circuit 300 of FIG. 3 are indicated generally by the reference numeral 400. The first metal line 332 completely covers and is connected to the first via 322; the second metal line 335 partially covers and is connected to the second via 325; a third metal line 433 partially covers and is connected to a third via 423; and a fourth metal line 435 partially covers and is connected to a fourth via 425.

While the second and third metal lines 335 and 433 have their vias 325 and 423 tilted in the elongated length direction of the respective metal lines, the fourth metal line 435 has its via 425 tilted in both the length and width directions. Thus, a gap between the metal lines 332 and 335 is greater than a gap between the vias 322 and 325. Similarly, a gap between the metal lines 433 and 435 is greater than a gap between the vias 423 and 425. Moreover, a gap between the metal lines 335 and 433 or 435 is greater than a gap between the vias 325 and 423.

Referring to the embodiments of FIGS. 3 and 4 using artificially-tilted metal via connections, for example, the metal line spacing may be widened without changing the via spacing relative to the examples of FIGS. 1 and 2. This increased metal line spacing may result in an improvement of the Time Dependent Dielectric Breakdown (TDDB) performance.

Figure 5:
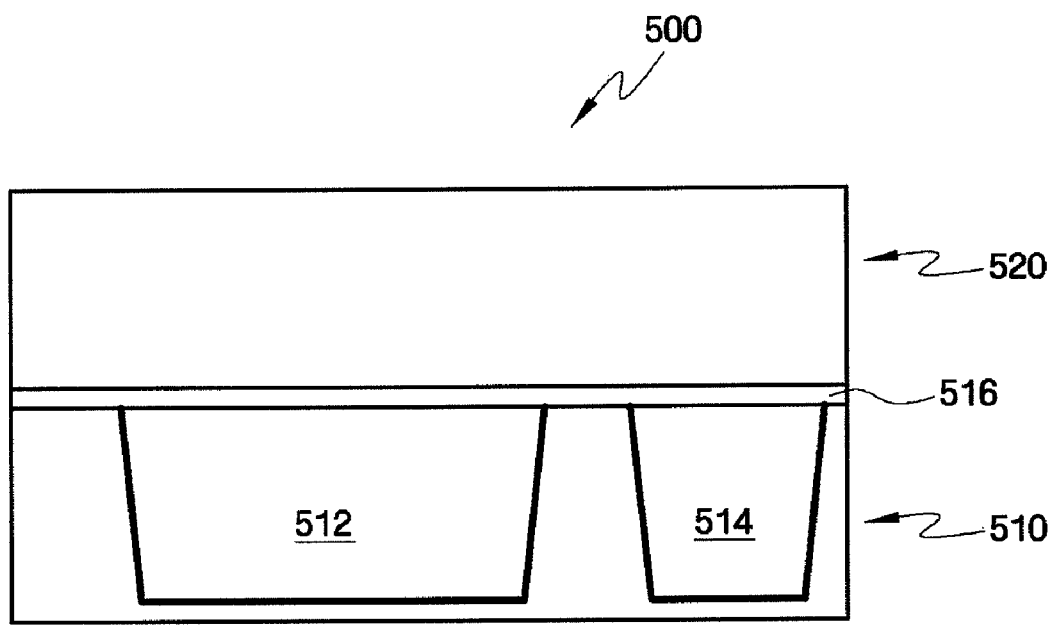
FIG. 5 shows a schematic side view of a semiconductor integrated circuit after an Inter Layer Dielectric (ILD) deposition step in accordance with an exemplary embodiment of the present disclosure.

Turning to FIG. 5, a semiconductor integrated circuit after an Inter Layer Dielectric (ILD) deposition step is indicated generally by the reference numeral 500. The semiconductor integrated circuit 500 includes a first layer 510 having logic structures 512 and 514; a first stop layer 516; and a second or ILD layer 520. Here, the ILD layer 520 is preferably deposited to substantially match the intended via height.

Figure 6:
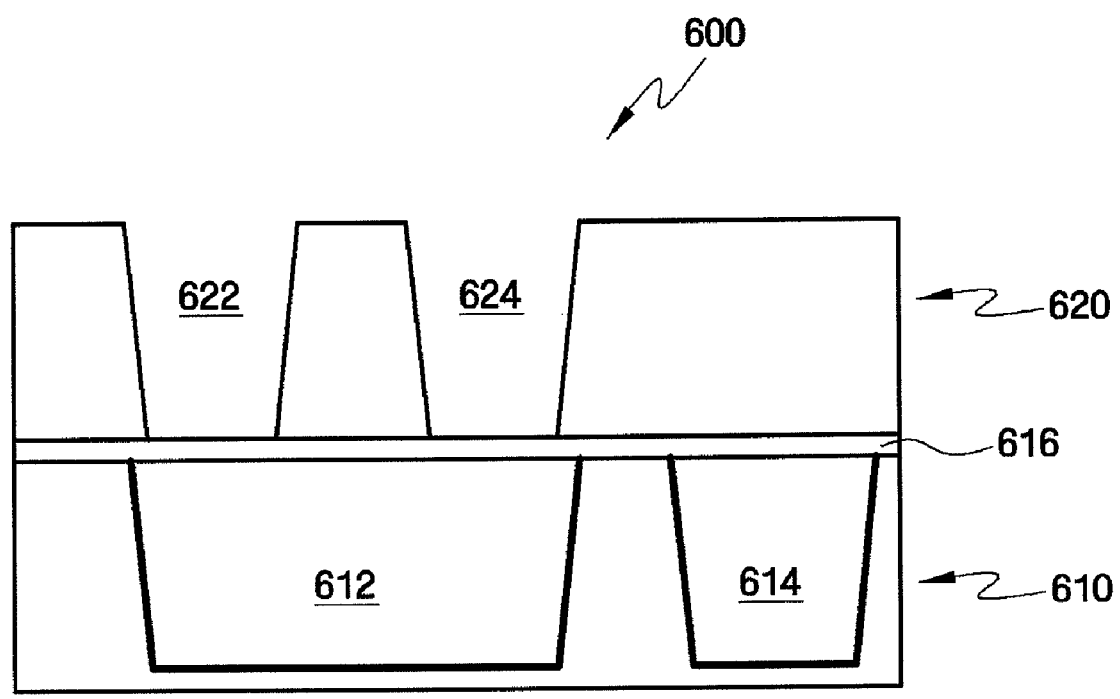
FIG. 6 shows a schematic side view of a semiconductor integrated circuit after a patterning step in accordance with an exemplary embodiment of the present disclosure.

Turning now to FIG. 6, a semiconductor integrated circuit after a patterning step is indicated generally by the reference numeral 600. The semiconductor integrated circuit 600 includes a first layer 610 having logic structures 612 and 614; a first stop layer 616; and a second layer 620 having first and second via patterns 622 and 624.

The patterning of the via contacts may use conventional lithography and Reactive Ion Etching (RIE) processes until touching the stop layer 616. In addition, the embodiment 600 can preferably achieve more process windows in lithography and Reactive Ion Etching (RIE) in terms of Critical Dimensions (CD), striation and the like by making shallow via patterns.

Figure 7:
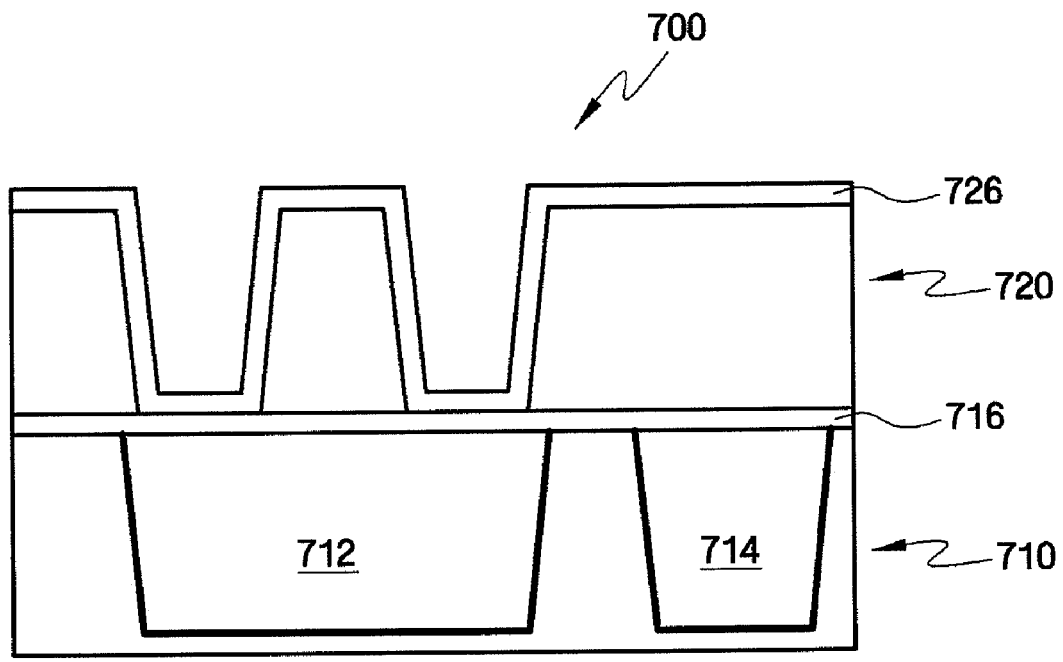
FIG. 7 shows a schematic side view of a semiconductor integrated circuit after an optional deposition step in accordance with an exemplary embodiment of the present disclosure.

Turning now to FIG. 7, a semiconductor integrated circuit after an optional deposition step is indicated generally by the reference numeral 700. The semiconductor integrated circuit 700 includes a first layer 710 having logic structures 712 and 714; a first stop layer 716; a second layer 720 with via patterns; and an optional thin layer 726. Advantageously, this optional deposition of an initial thin layer with conformal step coverage permits a decrease in the Critical Dimensions (CD) of the resulting vias.

Figure 8:
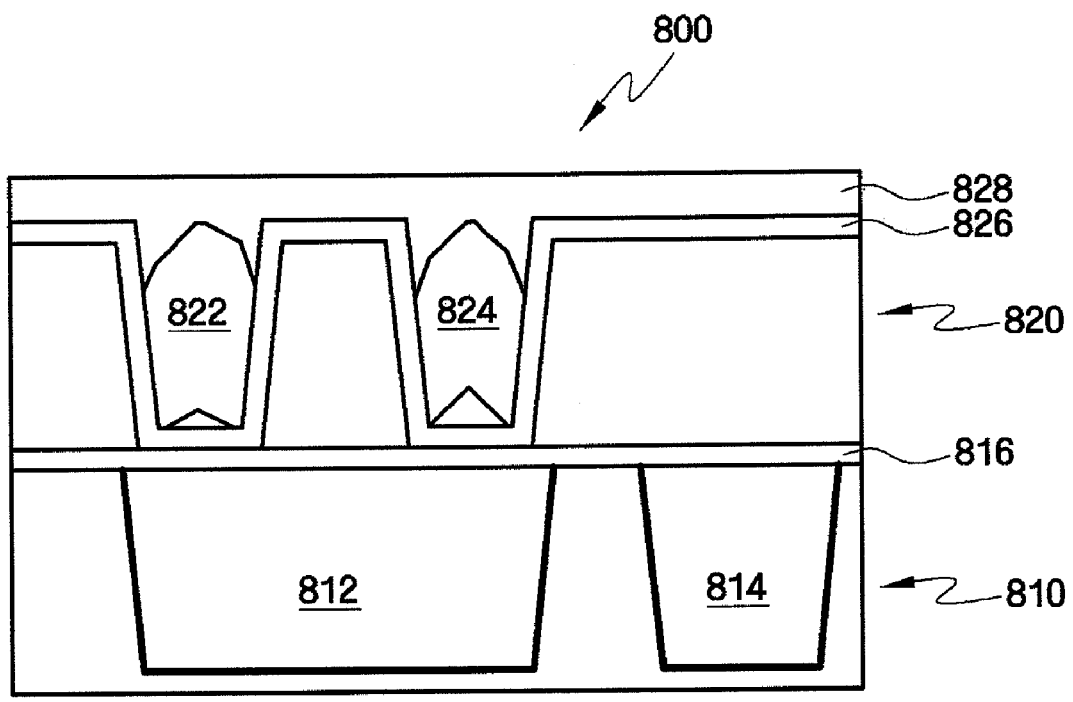
FIG. 8 shows a schematic side view of a semiconductor integrated circuit after a closing deposition step in accordance with an exemplary embodiment of the present disclosure.

As shown in FIG. 8, a semiconductor integrated circuit after a closing deposition step is indicated generally by the reference numeral 800. The semiconductor integrated circuit 800 includes a first layer 810 having logic structures 812 and 814; a first stop layer 816; a second layer 820 with via patterns 822 and 824; an optional thin layer 826; and a closing layer 828.

Here, the closing deposition step includes depositing a graded layer of Inter Layer Dielectric (ILD) film, and closing the via holes using process conditions with non-conformal step coverage in-situ with either the initial film or the following bulk film.

Figure 9:
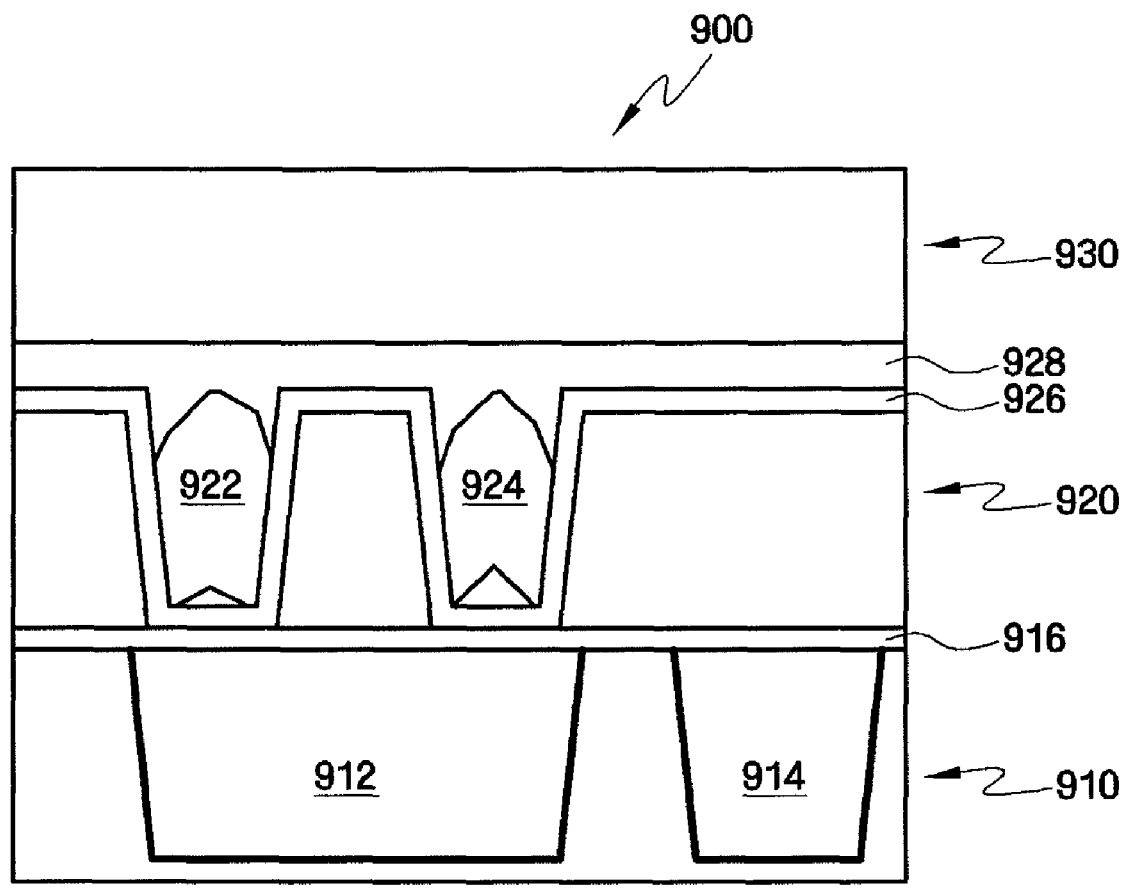
FIG. 9 shows a schematic side view of a semiconductor integrated circuit after a bulk deposition step in accordance with an exemplary embodiment of the present disclosure.

Turning now to FIG. 9, a semiconductor integrated circuit after a bulk deposition step is indicated generally by the reference numeral 900. The semiconductor integrated circuit 900 includes a first layer 910 having logic structures 912 and 914; a first stop layer 916; a second layer 920 with via patterns 922 and 924; an optional thin layer 926; a closing layer 928; and a bulk layer 930. The deposition of the bulk Inter Layer Dielectric (ILD) film is preferably of sufficient thickness to form the metal trench patterns.

Figure 10:
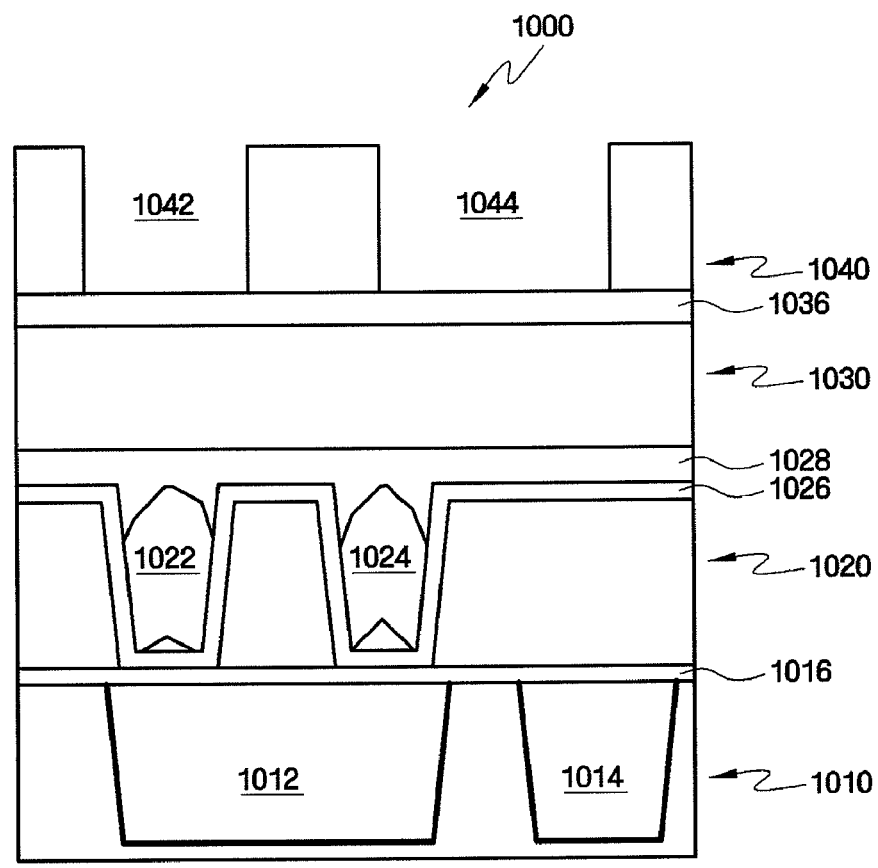
FIG. 10 shows a schematic side view of a semiconductor integrated circuit after a trench patterning step in accordance with an exemplary embodiment of the present disclosure.

As shown in FIG. 10, a semiconductor integrated circuit after a trench patterning step is indicated generally by the reference numeral 1000. The semiconductor integrated circuit 1000 includes a first layer 1010 having logic structures 1012 and 1014; a first stop layer 1016; a second layer 1020 with via patterns 1022 and 1024; an optional thin layer 1026; a closing layer 1028; a bulk layer 1030; another stop layer 1036; and a trench patterning layer 1040 having a first trench pattern 1042 and a second trench pattern 1044. Patterning of the trench may be accomplished using conventional or tuned lithography and Reactive Ion Etching (RIE) processes, as well as wet etch processes.

Figure 11:
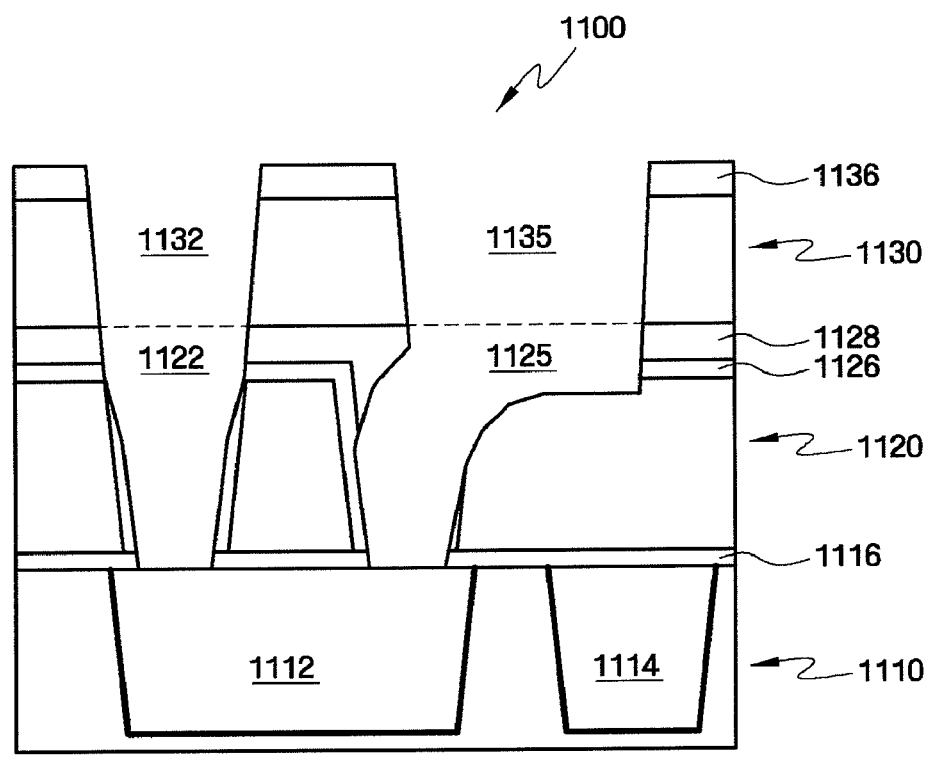
FIG. 11 shows a schematic side view of a semiconductor integrated circuit after a trench etching step in accordance with an exemplary embodiment of the present disclosure.

Turning to FIG. 11, a semiconductor integrated circuit after a trench etching step is indicated generally by the reference numeral 1100. The semiconductor integrated circuit 1100 includes a first layer 1110 having logic structures 1112 and 1114; a first stop layer 1116; a second layer 1120 with etched via trenches 1122 and 1125; an optional thin layer 1126; a closing layer 1128; a bulk layer 1130 with etched wireway trenches 1132 and 1135 connected to the etched via trenches 1122 and 1125, respectively; and another stop layer 1136. Preferably, the bottom of each via is opened under the shadow of Inter Layer Dielectric (ILD).

Figure 12:
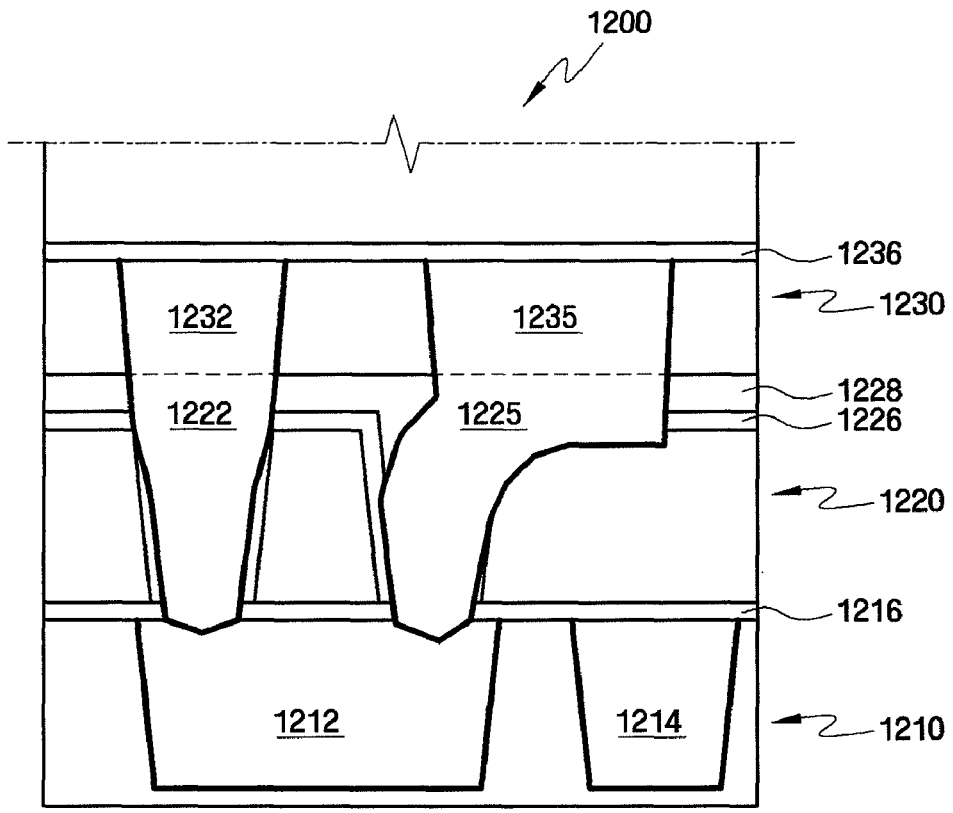
FIG. 12 shows a schematic side view of a semiconductor integrated circuit after a metal filling step in accordance with an exemplary embodiment of the present disclosure.

Turning now to FIG. 12, a semiconductor integrated circuit after a metal filling step is indicated generally by the reference numeral 1200. The semiconductor integrated circuit 1200 includes a first layer 1210 having logic structures 1212 and 1214; a first stop layer 1216; a second layer 1220 with metal-filled vias 1222 and 1225; an optional thin layer 1226; a closing layer 1228; a bulk layer 1230 with metal-filled wireways 1232 and 1235 connected to the metal-filled vias 1222 and 1225, respectively; and another stop layer 1236.

The metal filling may be accomplished using copper (Cu), for example, by either conventional or advanced barrier metal and seed copper deposition and plating process. Preferably, Atomic Layer Deposition (ALD) is applied to produce conformal thin films and/or to obtain robust barrier performance.

Figure 13:
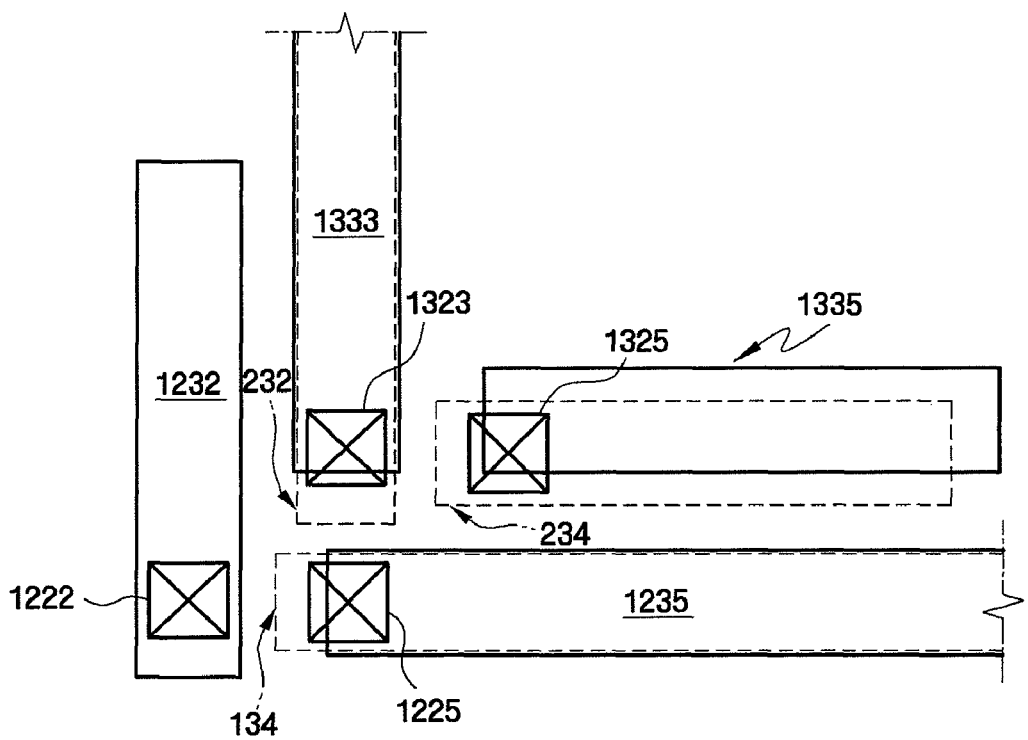
FIG. 13 shows a schematic top view of a semiconductor integrated circuit after a metal filling step in accordance with an exemplary embodiment of the present disclosure.

As shown in FIG. 13, metal lines and via connections of the semiconductor integrated circuit 1200 of FIG. 12 are indicated generally by the reference numeral 1300. The first metal line 1232 completely covers and is connected to the first via 1222; the second metal line 1235 partially covers and is connected to the second via 1225; a third metal line 1333 partially covers and is connected to a third via 1323; and a fourth metal line 1335 partially covers and is connected to a fourth via 1325.

While the second and third metal lines 1235 and 1333 have their vias 1225 and 1323 tilted in the elongated length direction of the respective metal lines, the fourth metal line 1335 has its via 1325 tilted in both the length and width directions.

Thus, a gap between the metal lines 1232 and 1235 is greater than a gap between the vias 1222 and 1225. Similarly, a gap between the metal lines 1333 and 1335 is greater than a gap between the vias 1323 and 1325. Moreover, a gap between the metal lines 1235 and 1333 or 1335 is greater than a gap between the vias 1225 and 1323.

Thus, the metal lines may be moved to gain more spacing relative to the prior art. Increased spacing of the metal lines results in an improvement of Time Dependent Dielectric Breakdown (TDDB), for example.

Figure 14:
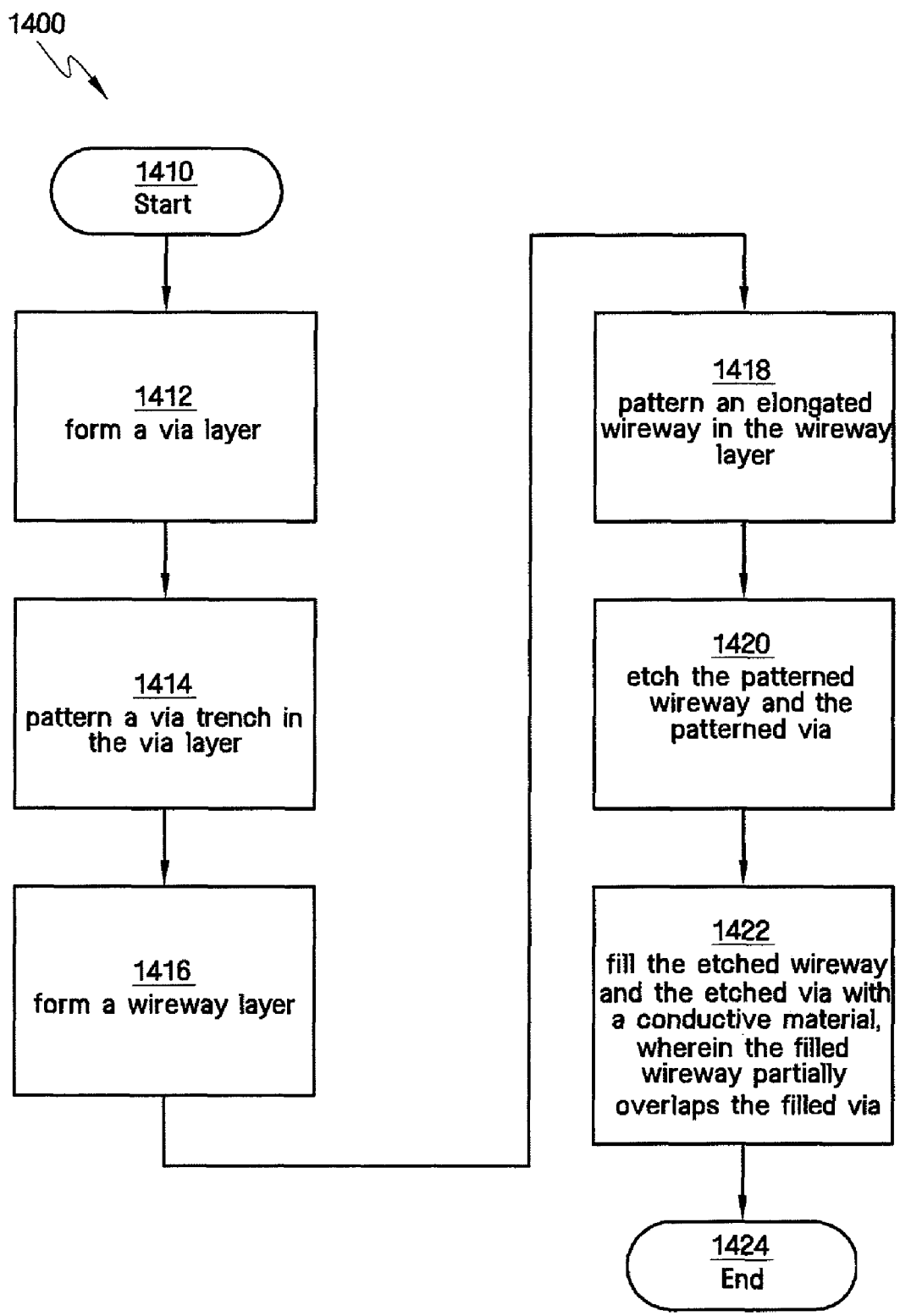
FIG. 14 shows a schematic flow diagram for a method of forming a tilted via connection in a semiconductor integrated circuit in accordance with an exemplary embodiment of the present disclosure.

Turning to FIG. 14, a method for forming a tilted via connection in a semiconductor integrated circuit is indicated generally by the reference numeral 1400. The method 1400 includes a start block 1410 that passes control to a function block 1412. The function block 1412 forms a via layer and passes control to a function block 1414. The function block 1414 patterns a via trench in the via layer, and passes control to a function block 1416. The function block 1416, in turn, forms a wireway layer and passes control to a function block 1418. The function block 1418 patterns an elongated wireway in the wireway layer and passes control to a function block 1420.

The function block 1420, in turn, etches the patterned wireway and the patterned via and passes control to a function block 1422. The function block 1422 fills the etched wireway and the etched via with a conductive material, wherein the filled wireway partially overlaps the filled via, and passes control to an end block 1424.

In addition, alternate embodiments are contemplated. For example, the artificially tilted vias need not be made of copper (Cu), but may be formed of other metals and/or alternate conductive and/or semi-conductive materials.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. A method for forming an artificially tilted via connection in a semiconductor integrated circuit, the method comprising:
   forming a via layer;
   patterning a via trench in the via layer;
   forming a wireway layer;
   patterning an elongated wireway in the wireway layer;
   etching the patterned wireway and the patterned via to form an etched wireway directly on an etched tilted via; and
   filling the etched wireway and the etched tilted via with a conductive material,
   wherein the filled wireway partially overlaps and is directly connected to the filled tilted via.

2. A method as defined in claim 1 wherein a portion of the via extends from at least an end of the elongated wireway.

3. A method as defined in claim 1 wherein a portion of the via extends from at least a side of the elongated wireway.

4. A method as defined in claim 1 wherein the filled wireway completely overlaps a top end of the filled via.

5. A method as defined in claim 1 wherein the filled wireway does not overlap a bottom end of the filled via.

6. A method as defined in claim 1 wherein the conductive material comprises metal.

7. A method as defined in claim 1 wherein the conductive material comprises copper (Cu).

8. A method as defined in claim 1 wherein the artificially tilted via connection is realized within a copper dual-damascene process.

9. A method as defined in claim 1, further comprising applying a Chemical Vapor Deposition (CVD) process to close the via trench before patterning the wireway trench.

10. A method as defined in claim 9 wherein the CVD process comprises at least one of SiO2, SiH4, TEOS, OMCTS2.7, p-SiCOH (with k=2.4, 2.2 and lower k) to meet electrical performance criteria.

11. A method as defined in claim 9 wherein the CVD process comprises application of CVD skills and process conditions to control the via Critical Dimensions (CD) in-situ.

12. A method as defined in claim 9 wherein the CVD process comprises application of CVD skills and process conditions to control the via Critical Dimensions (CD) ex-situ.

13. A method as defined in claim 1, patterning comprising at least one of lithography or Reactive Ion Etching (RIE).

14. A method as defined in claim 13, lithography comprising at least one rule to draw the photo mask or to generate an Optical Proximity Correction (OPC).

15. A method as defined in claim 1, etching comprising at least one of Reactive Ion Etching (RIE) or wet etching.

16. A method as defined in claim 1, filling comprising at least one of a barrier metal or seed copper deposition process.

17. A method as defined in claim 16, the at least one barrier metal or seed copper deposition process comprising at least one of Pre-Metal Deposition (PMD), Chemical Vapor Deposition (CVD), or Atomic Layer Deposition (ALD).

18. A method as defined in claim 1, filling comprising copper plating to satisfy gap-filling performance criteria.

19. A method as defined in claim 1, forming the via layer comprising deposition of an Inter Layer Dielectric (ILD) layer substantially the same height as the trench to be formed therein.

* * * * *